US009620594B2

(12) United States Patent
Chen et al.

(10) Patent No.: US 9,620,594 B2
(45) Date of Patent: Apr. 11, 2017

(54) MEMORY DEVICE, MEMORY CELL AND MEMORY CELL LAYOUT

(71) Applicant: TAIWAN SEMICONDUCTOR MANUFACTURING COMPANY, LTD., Hsinchu (TW)

(72) Inventors: Shih-Hsien Chen, Zhubei (TW); Liang-Tai Kuo, Zhudong Township (TW); Hau-Yan Lu, Hsinchu (TW); Chun-Yao Ko, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/500,425

(22) Filed: Sep. 29, 2014

(65) Prior Publication Data

US 2016/0093628 A1 Mar. 31, 2016

(51) Int. Cl.
*H01L 27/108* (2006.01)
*H01L 29/10* (2006.01)
*H01L 29/49* (2006.01)
*H01L 27/02* (2006.01)
*H01L 23/528* (2006.01)
*H01L 27/11558* (2017.01)
*H01L 29/66* (2006.01)
*H01L 29/94* (2006.01)

(52) U.S. Cl.
CPC ........ *H01L 29/1095* (2013.01); *H01L 23/528* (2013.01); *H01L 27/0207* (2013.01); *H01L 27/11558* (2013.01); *H01L 29/4916* (2013.01); *H01L 29/66825* (2013.01); *H01L 29/66181* (2013.01); *H01L 29/94* (2013.01); *H01L 2924/0002* (2013.01)

(58) Field of Classification Search
CPC ..... H01L 51/56; H01L 33/62; H01L 51/0072; H01L 51/5206; H01L 33/54
USPC .................................................. 257/296, 315
See application file for complete search history.

(56) References Cited

U.S. PATENT DOCUMENTS

| 6,711,064 B2 | 3/2004 | Hsu et al. |
| 6,788,574 B1 | 9/2004 | Han et al. |
| 9,431,107 B2 | 8/2016 | Kalnitsky et al. |
| 2009/0159946 A1* | 6/2009 | Huang ............... G11C 16/0441 257/296 |
| 2009/0290417 A1* | 11/2009 | Park ................... G11C 16/0433 365/185.08 |
| 2015/0001608 A1* | 1/2015 | Tan ................... H01L 29/42324 257/321 |

FOREIGN PATENT DOCUMENTS

| JP | 2005-175411 | 6/2005 |
| KR | 10-1310075 | 9/2013 |
| KR | 10-2014-0077812 | 6/2014 |

OTHER PUBLICATIONS

Office Action dated Oct. 18, 2016 and English translation from corresponding application No. KR 10-2015-0135706.

* cited by examiner

*Primary Examiner* — Andy Huynh
(74) *Attorney, Agent, or Firm* — Hauptman Ham, LLP

(57) ABSTRACT

A memory device includes at least one memory cell. The memory cell includes first and second transistors, and first and second capacitors. The first transistor is coupled to a source line. The second transistor is coupled to the first transistor and a bit line. The first capacitor is coupled to a word line and the second transistor. The second capacitor is coupled to the second transistor and an erase gate.

20 Claims, 7 Drawing Sheets

MEMORY DEVICE, MEMORY CELL AND MEMORY CELL LAYOUT

BACKGROUND

Processors and memories are parts of computing systems and electronic devices. The performance of a memory impacts the overall performance of the system or electronic device. Various circuits and/or operating methods are developed to improve one or more aspects of memory performance, such as access speed, power consumption, read margin, endurance, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
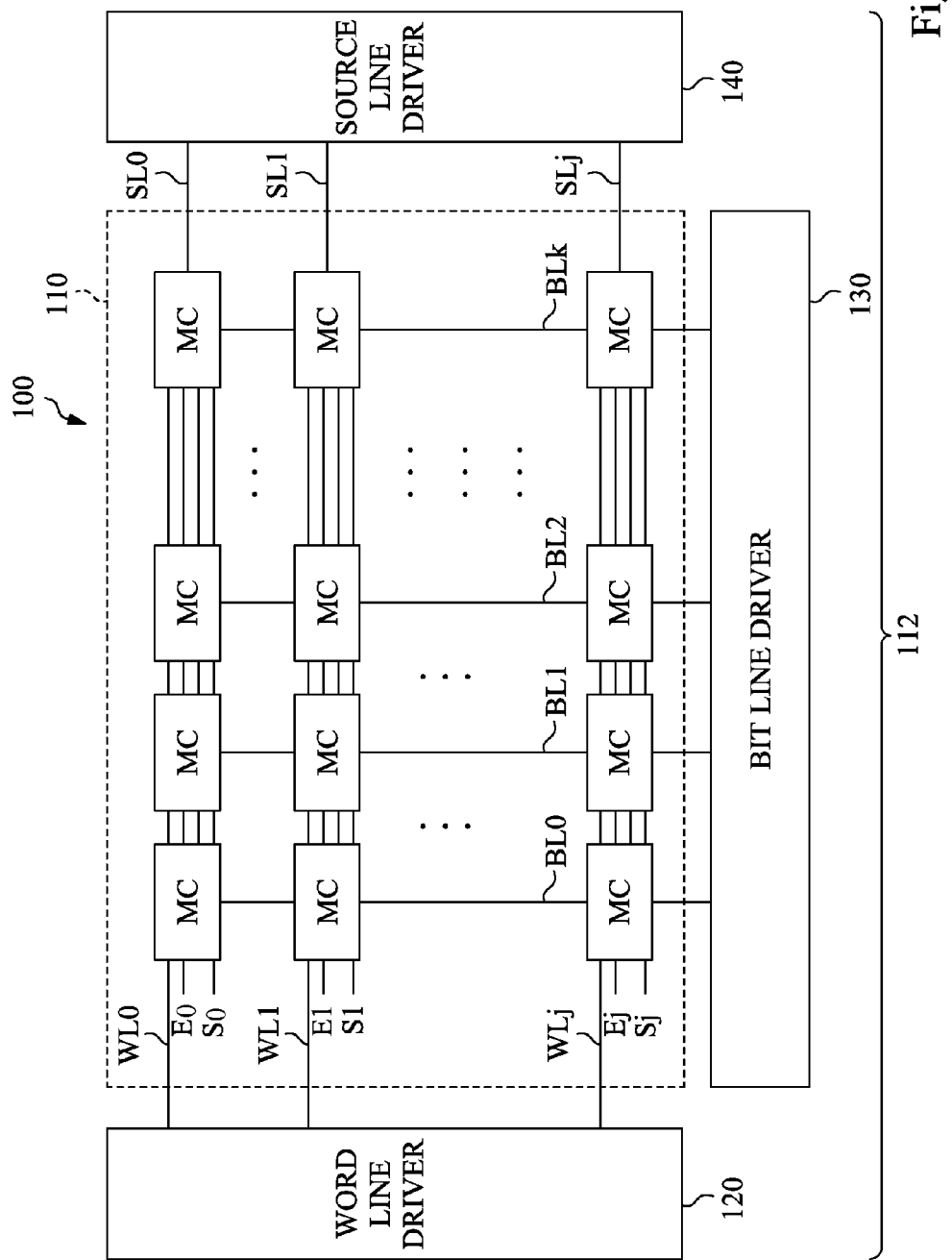
FIG. 1 is a block diagram of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, when a first element is described as being "connected" or "coupled" to a second element, such description includes embodiments in which the first and second elements are directly connected or coupled to each other, and also includes embodiments in which the first and second elements are indirectly connected or coupled to each other with one or more other intervening elements in between.

FIG. 1 is a block diagram of a memory device 100 in accordance with some embodiments. The memory device 100 includes a memory array 110, and a memory controller 112. The memory array 110 includes a plurality of memory cells MC arranged in a plurality of rows and columns. The memory cells MC in each column are coupled to a corresponding one among a plurality of (k+1) bit lines BL0-BLk. The memory cells MC in each row are coupled to a corresponding one among a plurality of (j+1) word lines WL0-WLj, a corresponding one among a plurality of (j+1) source lines SL0-SLj, a corresponding one among a plurality of (j+1) erase lines E0-Ej, and a corresponding one among a plurality of (j+1) selector lines S0-Sj. Various numbers of word lines and/or bit lines and/or source lines and/or erase lines and/or selector lines in the memory array 110 are within the scope of various embodiments. In at least one embodiment, the source lines are arranged in the columns, rather than in the rows as shown in FIG. 1.

In one or more embodiments, the memory cells MC include multiple time programmable (MTP) memory cells. Examples of MTP memory include, but are not limited to, electrically erasable programmable read-only memory (EEPROM), flash memory, etc. In one or more embodiments, the memory cells MC include single-level memory cells each of which is configured to store 1 bit of data. In at least one embodiment, the memory cells MC include multi-level memory cells each of which is configured to store 2 or more bits of data. A threshold voltage of a memory cell MC depends on a logic state of data stored in the memory cell MC. For example, for a single-level memory cell, the threshold voltage when the memory cell is in an erased logic state (i.e., the memory cell stores a logic "1") is lower than when the memory cell is in a programmed state (i.e., the memory cell stores a logic "0"). For a multi-level memory cell, the memory cell has more than two threshold voltages corresponding to more than two logic states of the multi-level memory cell. The memory cell MCs are switchable between the logic states and have different threshold voltages corresponding to the logic states.

The memory controller 112 is configured to detect the threshold voltage of a memory cell MC, in a read operation, to read a datum stored in the memory cell MC. The memory controller 112 is further configured to write a datum, in a write operation, to a memory cell MC. In at least one embodiment, a write operation includes an erase operation (i.e., write "1") or a program operation (i.e., write "0"). The memory controller 112 includes a word line driver 120, a bit line driver 130, and a source line driver 140 to perform a read operation or a write operation. The word line driver 120 is coupled to the memory array 110 via the word lines WL0-WLj. The bit line driver 130 is coupled to the memory array 110 via the bit lines BL0-BLk. The source line driver 140 is coupled to the memory array 110 via the source lines SL0-SLj. In at least one embodiment, the erase lines E0-Ej and/or the selector lines S0-Sj are coupled to the word line driver 120. Other arrangements are within the scope of various embodiments. In at least one embodiment, the memory controller 112 further includes one or more clock generators for providing clock signals for various components of the memory device 100, one or more input/output (I/O) units for data exchange with external devices, one or more sensing amplifiers for sensing data stored in the memory array 110, and/or one or more controllers for controlling various operations in the memory device 100. Other memory device configurations are within the scope of various embodiments. In some embodiments, by controlling voltages applied to one or more of the word lines WL0-WLj, bit lines BL0-BLk, source lines SL0-SLj, erase lines E0-Ej and selector lines S0-Sj, various memory cells MC in the memory device 100 are programmed, read or erased.

Figure 2A:
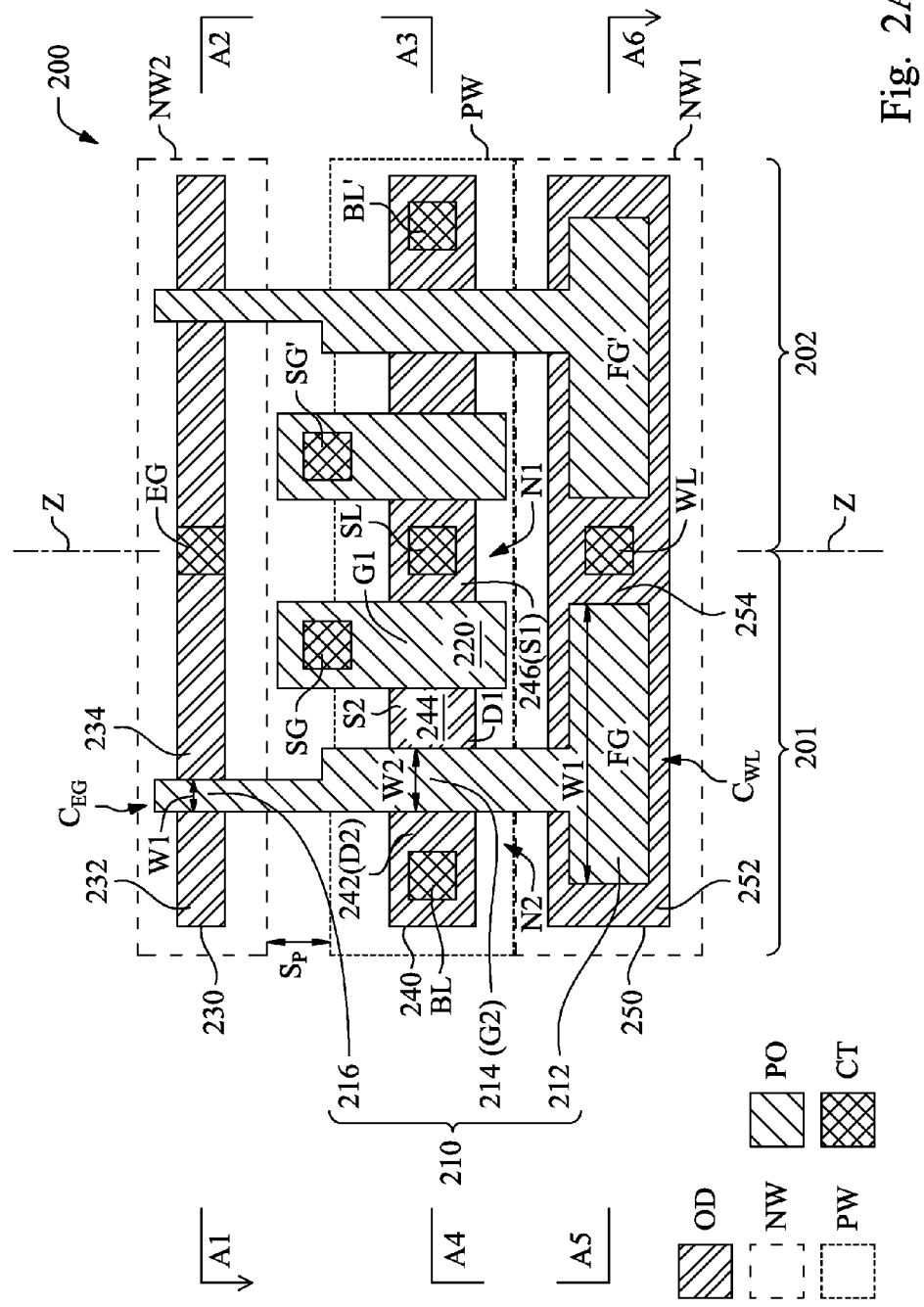
FIG. 2A is a layout of a memory device in accordance with some embodiments.

FIG. 2A is a layout of a memory device 200, in accordance with some embodiments. The semiconductor device 200 comprises at least one memory cell. Two memory cells 201 and 202 are shown in FIG. 2A, for example. In at least one embodiment, each of the memory cells 201 and 201 corresponds to a memory cell MC described with respect to FIG. 1. In the example configuration in FIG. 2A, the memory cell 201 and the memory cell 202 are symmetrical with each other across an axis Z. Other arrangements are within the scope of various embodiments. The memory cell 201 is described herein, and a detailed description of the memory cell 202 is omitted.

The memory cell 201 comprises conductive patterns 210 and 220, and active area patterns 230, 240 and 250. The conductive patterns 210 and 220 are discrete one from another. The conductive pattern 210 (also referred to herein as floating gate FG) extends continuously over the active area patterns 230, 240 and 250. The conductive pattern 210 includes a first portion 212 over the active area pattern 250, a second portion 214 over the active area pattern 240, and third portion 216 over the active area pattern 230. The conductive pattern 220 extends over the active area pattern 240. In at least one embodiment, the conductive pattern 210 and the conductive pattern 220 belong to the same layer of conductive material. An example material of the conductive pattern 210 and conductive pattern 220 is polysilicon. Other materials are within the scope of various embodiments. The conductive pattern 210 and conductive pattern 220 of the memory cell 201, and corresponding conductive patterns (e.g., a floating gate FG') of the memory cell 202 are schematically illustrated in FIG. 2A with the label "PO."

The active area patterns 230, 240 and 250 are discrete one from another. The active area patterns 230, 240 and 250 are also referred to herein as "OD patterns," i.e., oxide-definition (OD) patterns, and are schematically illustrated in FIG. 2A with the label "OD." Example materials of the active area patterns 230, 240 and 250 include, but are not limited to, semiconductor materials doped with various types of p-dopants and/or n-dopants. In at least one embodiment, the active area patterns 230, 240 and 250 include dopants of the same type. In at least one embodiment, at least one of the active area patterns 230, 240 and 250 includes dopants of a type different from a type of dopants of another one of the active area patterns 230, 240 and 250. The active area patterns 230, 240 and 250 are within corresponding well regions. In the example configuration in FIG. 2A, the active area pattern 230 is within a well region NW2 which is an n-well, the active area pattern 240 is within a well region PW which is a p-well, and the active area pattern 250 is within a well region NW1 which is an n-well. The described conductivity of the well regions is an example. Other arrangements are within the scope of various embodiments. The n- and p-wells are schematically illustrated in FIG. 2A with the corresponding labels "NW" and "PW."

The active area pattern 230 has the same type of dopants as the corresponding well region NW2. For example, both the active area pattern 230 and the corresponding well region NW2 include n-type dopants. The active area pattern 230 and the well region NW2 having the same type of dopants are configured to form a first electrode of a capacitor $C_{EG}$. A second electrode of the capacitor $C_{EG}$ is configured by the third portion 216 of the conductive pattern 210 which extends over the active area pattern 230 and well region NW2. The third portion 216 of the conductive pattern 210 overlaps the active area pattern 230 and well region NW2 in an overlapping area which determines a capacitance of the capacitor $C_{EG}$. The active area pattern 230 includes regions 232 and 234 on opposite sides of the third portion 216 of the conductive pattern 210. A conductor EG (also referred to herein as an erase gate EG) is arranged in the region 234 to provide an electrical connection from the first electrode of the capacitor $C_{EG}$ to an erase line, such as a corresponding one of the erase lines E0-Ej described with respect to FIG. 1, for erasing the memory cell 201.

The active area pattern 240 has a type of dopants different in type from that of the corresponding well region PW. For example, the active area pattern 240 includes n-type dopants, and the corresponding well region PW includes p-type dopants. The active area pattern 240, the well region PW, and the conductive pattern 220 extending over the well region PW are configured to form a transistor N1, which is a selector transistor of the memory cell 201. The active area pattern 240, the well region PW, and the second portion 214 of the conductive pattern 210 extending over the well region PW are configured to form a transistor N2, which is a storage transistor of the memory cell 201. Examples of the transistors N1 and N2 include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, etc. In at least one embodiment, the transistors N1 and N2 are n-channel metal-oxide semiconductor (NMOS) transistors. In at least one embodiment, the transistors N1 and N2 are p-channel metal-oxide semiconductor (PMOS) transistors.

The second portion 214 of the conductive pattern 210 and the conductive pattern 220 divide the active area pattern 240 into regions 242, 244 and 246. The regions 244 and 246 of the active area pattern 240 are arranged on opposite sides of the conductive pattern 220, and are configured to form corresponding drain D1 and source S1 of the transistor N1. A gate G1 of the transistor N1 is configured by the conductive pattern 220. A conductor SG (also referred to herein as a selector gate SG) is arranged in the conductive pattern 220 to provide an electrical connection from the gate G1 of the transistor N1 to a selector line, such as a corresponding one of the selector lines S0-Sj described with respect to FIG. 1, for programming and/or reading memory cell 201. A conductor SL (also referred to herein as a source line SL) is arranged in the region 246 to provide an electrical connection from the source S1 of the transistor N1 to a source line, such as a corresponding one of the source lines SL0-SLj described with respect to FIG. 1, for programming and/or reading memory cell 201.

The regions 242 and 244 of the active area pattern 240 are arranged on opposite sides of the second portion 214 of the conductive pattern 210, and are configured to form corresponding drain D2 and source S2 of the transistor N2. A gate G2 of the transistor N2 is a floating gate configured by the second portion 214 of the conductive pattern 210. A conductor BL (also referred to herein as a bit line BL) is arranged in the region 242 to provide an electrical connection from the drain D2 of the transistor N2 to a bit line, such as a corresponding one of the bit lines BL0-BLk described with respect to FIG. 1, for programming and/or reading memory cell 201. The region 244 of the active area pattern 230 is arranged between the gates G1 and G2 of the transistors N1 and N2, and is configured to form both the drain D1 of the transistor N1 and the source S2 of the transistor N2. As a result, the transistor N1 and transistor N2 are serially coupled.

The active area pattern 250 has the same type of dopants as the corresponding well region NW1. For example, both the active area pattern 250 and the corresponding well region NW1 include n-type dopants. The active area pattern 250 and the well region NW1 having the same type of dopants are configured to form a first electrode of a capacitor $C_{WL}$. A second electrode of the capacitor $C_{WL}$ is configured by the first portion 212 which extends over the active area pattern 250 and well region NW1. The first portion 212 overlaps the active area pattern 250 and well region NW1 in an overlapping area which determines a capacitance of the capacitor $C_{WL}$. The active area pattern 250 includes regions 252 and 254 on opposite sides of the first portion 212 of the conductive pattern 210. A conductor WL (also referred to herein as a word line WL) is arranged in the region 254 to provide an electrical connection from the first electrode of the capacitor $C_{WL}$ to a word line, such as a corresponding one of the word lines WL0-WLj described with respect to FIG. 1, for reading and/or programming the memory cell 201. The conductors EG, SG, SL, BL, WL of the memory cell 201 and corresponding conductors (e.g., SG' and BL') of the memory cell 202 are schematically illustrated in FIG. 2A with the label "CT."

In some embodiments, the capacitance of the capacitor $C_{WL}$, is configured to be larger than the capacitance of the capacitor $C_{EG}$, i.e., $C_{WL} > C_{EG}$. To achieve the relationship $C_{WL} > C_{EG}$, in at least one embodiment, the area in which the conductive pattern 210 extends over the active area pattern 250 and the corresponding well region NW1 is configured to be larger than the area in which the conductive pattern 210 extends over the active area pattern 230 and the corresponding well region NW2. In the example configuration in FIG. 2A, when seen along an elongation direction of the active area pattern 230 (i.e., the direction transverse to the axis Z), a width W1 of the first portion 212 of the conductive pattern 210 over the active area pattern 250 is greater than a width W3 of the third portion 216 of the conductive pattern 210 over the active area pattern 230. In addition, when seen along the elongation direction of the active area pattern 230, a width W2 of the second portion 214 of the conductive pattern 210 over the active area pattern 240 is smaller than the width W1 and is greater than the width W3. Other arrangements for achieving the relationship $C_{WL} > C_{EG}$ are within the scope of various embodiments.

In the example configuration in FIG. 2A, the well region PW shares a border with the well region NW1, and the well region PW is spaced, by a spacing Sp, from the well region NW2. In some embodiments, the spacing Sp is configured to reduce the chances of a junction breakdown. Other arrangements are within the scope of various embodiments.

Figure 2B:
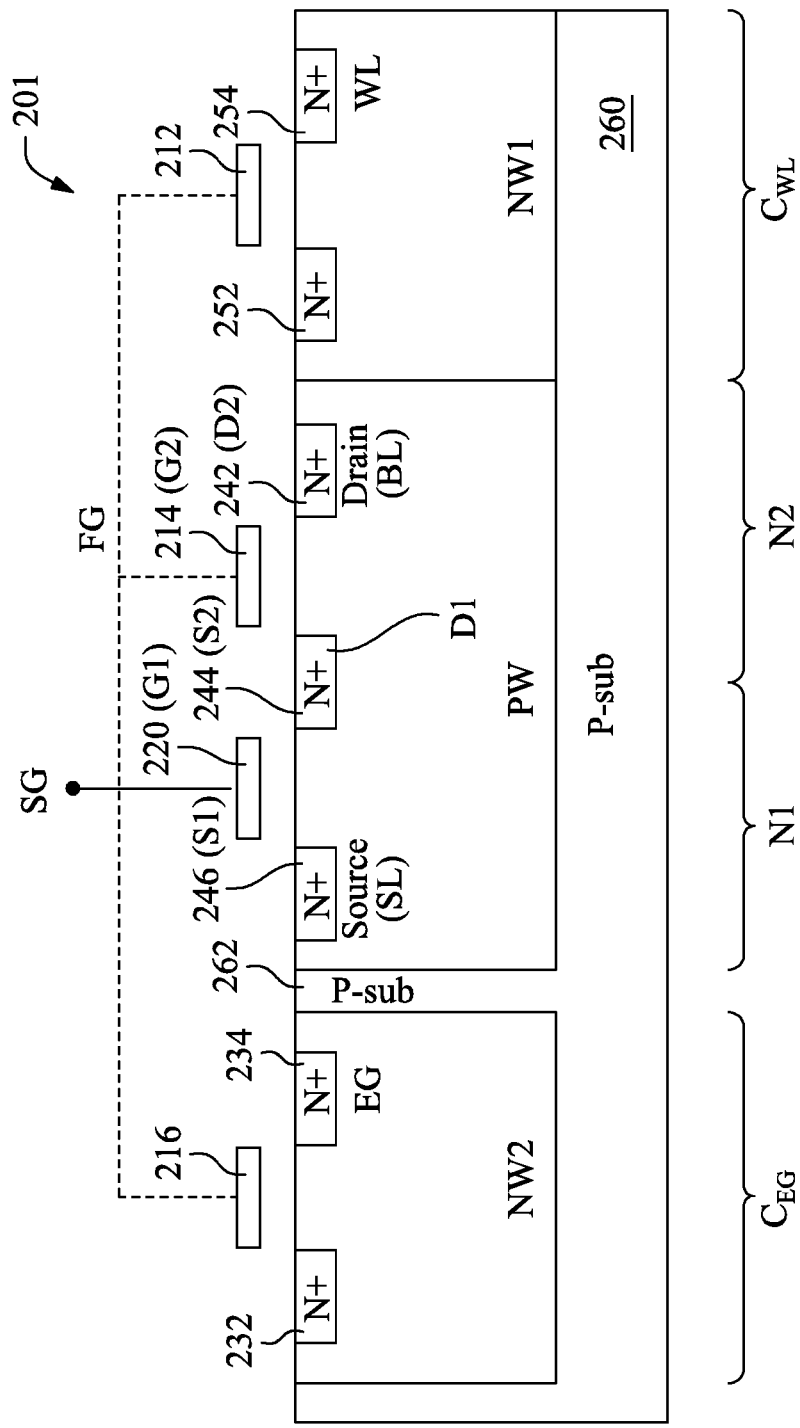
FIG. 2B is a partial cross-sectional view taken along line A1-A6 in FIG. 2A and shows a memory cell in accordance with some embodiments.

FIG. 2B is a partial cross-sectional view taken along line A1-A2-A3-A4-A5-A6 in FIG. 2A and shows the memory cell 201 in accordance with some embodiments. The memory cell 202 is omitted in the partial view of FIG. 2B. The memory cell 201 comprises a substrate 260 over which the components of the memory cell 201 as described with respect to FIG. 2A are. Specifically, the well regions NW1, PW and NW2 are in the substrate 260. The regions 232 and 234 are in the well region NW1, the regions 242, 244 and 246 are in the well region PW, and the regions 252 and 254 are in the well region NW1. The regions 232, 234, 242, 244, 246, 252 and 254 are n+ doped regions. The first through third portions 212, 214 and 216 of the floating gate FG are over the corresponding well regions NW1, PW and NW2. The conductive pattern 220 is over the well region PW. The floating gate FG and the conductive pattern 220 belong to the same conductive layer, which, in at least one embodiment, includes a single polysilicon layer over the substrate 260. A gate oxide layer (not shown) is between the substrate 260 and the single polysilicon layer. The region 234 is coupled to the erase gate EG. The region 246 is coupled to the source line SL and is designated as the source of the memory cell 201. The region 242 is coupled to the bit line BL and is designated as the drain of the memory cell 201. The region 254 is coupled to the word line WL.

Example materials of the substrate 260 include, but are not limited to, silicon germanium (SiGe), gallium arsenic, or other suitable semiconductor materials. In at least one embodiment, the substrate 260 is a p-type substrate. Example materials of the gate oxide layer include, but are not limited to, a high-k dielectric layer, an interfacial layer, and/or combinations thereof. Example materials for the high-k dielectric layer include, but are not limited to, silicon nitride, silicon oxynitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2 \rightarrow Al_2O_3$) alloy, other suitable high-k dielectric materials, and/or combinations thereof. In some embodiments, the memory cell 201 further includes one or more additional features (not shown) including, but not limited to, isolation structures, spacers, silicided regions, one or more gate metal layers, lightly doped source/drain (LDD) regions, and inter-layer dielectric (ILD) layers. In at least one embodiment, one or more of the described layers and/or described components of the memory cell 201 are formed by one or more semiconductor manufacturing processes, including, but not limited to, photolithography, etching, planarization, ion implantation, various film deposition techniques, and the like. In an example manufacturing process in accordance with some embodiments, the well regions NW1 and NW2 are formed in the substrate 260 by, e.g., ion implantation of an n-type dopant into the substrate 260. Example n-type dopants include, but are not limited to, phosphorous, arsenic, antimony, and combinations thereof. The well region PW is formed in the substrate 260 by, e.g., ion implantation of a p-type dopant into the substrate 260. Example p-type dopants include, but are not limited to, boron, indium, and combinations thereof. A dielectric layer is formed over the well regions NW1, NW2 and PW. A conductive layer is formed over the dielectric layer. The conductive layer and the dielectric layer are patterned, e.g., by photolithography and etching processes, to form the conductive patterns 210, 220 and the corresponding gate oxide layers between the conductive patterns 210, 220 and the substrate 260. The regions 232, 234, 242, 244, 246, 252 and 254 are formed in the corresponding well regions NW2, PW and NW1 by, e.g., ion implantation of an n-type dopant into the corresponding well regions. The conductors BL, WL, SL and EG are formed over the corresponding regions 242, 254, 246 and 234, and the conductor SG is formed over the conductive pattern 220. Example materials of the conductors BL, WL, SL, EG, and SG include, but are not limited to, aluminum, aluminum/silicon/copper alloy, titanium, titanium nitride, tungsten, polysilicon, metal silicide, copper, copper alloy, titanium, titanium nitride, tantalum, tantalum nitride, tungsten, polysilicon, metal silicide, or combinations thereof.

The n+ doped regions 252, 254 in the n-well region NW1 are configured to form, together with the first portion 212 of the floating gate FG, an n-type capacitor $C_{WL}$. The n+ doped regions 232, 234 in the n-well region NW2 are configured to form, together with the third portion 216 of the floating gate FG, an n-type capacitor $C_{EG}$. The n+ doped regions 246, 244 in the p-well region PW are configured to form, together with the conductive pattern 220 coupled to the selector gate SG, a selector transistor N1 which is an NMOS. The n+ doped regions 244, 242 in the p-well region PW are configured to form, together with the second portion 214 of the floating gate FG, a storage transistor N2 which is an NMOS having a floating gate.

In the example configuration in FIG. 2B, the well region PW shares a border with the well region NW1. Other arrangements are within the scope of various embodiments. In the example configuration in FIG. 2B, the well region PW is spaced from the well region NW2 by a portion 262 of the substrate 260. The portion 262 in one or more embodiments corresponds to the spacing Sp described with respect to FIG. 2A. In some situations, when the well region PW shares a border with the well region NW2, a p-n junction exists between the well region PW and the well region NW2. Such p-n junction has a breakdown voltage of about 15 V in some situations. During operation of the memory cell, when a voltage higher than the breakdown voltage of the p-n junction is applied across the p-n junction, there is a potential risk that the p-n junction will be damaged. An example situation when a voltage higher than the breakdown voltage of the p-n junction is applied across the p-n junction involves an erase operation in which a high voltage, e.g., 20 V-30 V, is applied to the well region NW2 via the erase gate EG and the ground voltage is applied to the well region PW (as a bulk voltage) and/or to the source S1 (as a source line voltage). To reduce the potential risk associated with such high voltages, the portion 262 of the substrate 260 is maintained (i.e., not doped when dopants are implanted into the well region NW2 and the well region PW) between the well region PW and the well region NW2. Other arrangements for reducing a likelihood of a potential breakdown between the well region PW and the well region NW2 are within the scope of various embodiments. For example, in one or more embodiments, an isolation structure, such as a shallow trench isolation (STI) region, is formed between the well region PW and the well region NW2. In at least one embodiment, when an isolation structure is formed, such an isolation structure is as deep as at least one of the well region PW or the well region NW2.

Figure 2C:
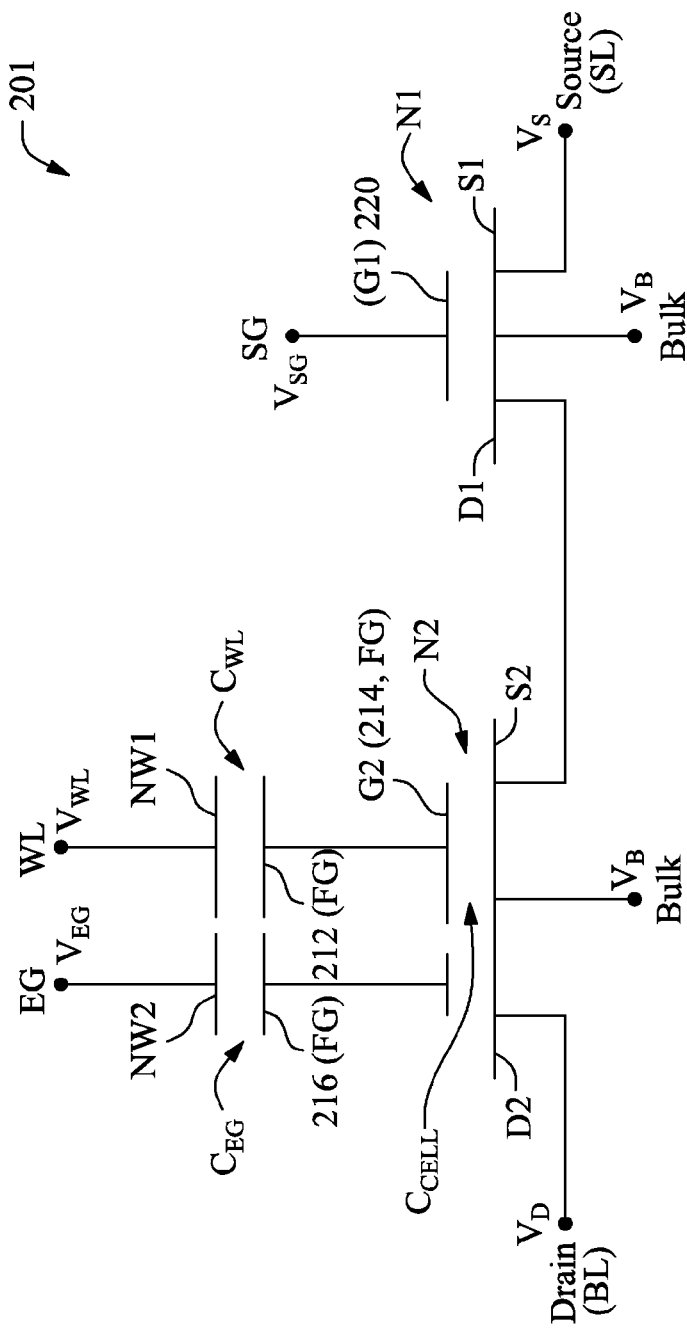
FIG. 2C is a circuit diagram of the memory cell in FIG. 2B, in accordance with some embodiments.

FIG. 2C is a circuit diagram of the memory cell 201 in FIG. 2B, in accordance with some embodiments. The memory cell 201 has a two-transistor-two-capacitor (2T2C) configuration and comprises two transistors and two capacitors. The two transistors include the transistor N1 which is a selector transistor, and the transistor N2 which is a storage transistor. The two capacitors include the capacitor $C_{WL}$ for capacitive coupling between the floating gate FG and the word line WL, and the capacitor $C_{EG}$ for capacitive coupling between the floating gate FG and the erase gate EG. The transistor N1 has the gate G1 coupled to the selector gate SG, the source S1 coupled to the source line SL, and the drain D1 coupled to the source S2 of the transistor N2. The transistor N2 has a floating gate configured by the second portion 214 of the floating gate FG, and the drain D2 coupled to the bit line BL. The capacitor $C_{WL}$ has a first electrode configured by the well region NW1 coupled to the word line WL, and a second electrode configured by the first portion 212 of the floating gate FG. The capacitor $C_{EG}$ has a first electrode coupled to the erase gate EG, and a second electrode configured by the third portion 216 of the floating gate FG.

In operation of the memory cell 201 in accordance with some embodiments, a voltage $V_D$ is applied via the bit line BL to the drain of the memory cell 201 (i.e., the drain D2 of the transistor N2). A voltage $V_S$ is applied via the source line SL to the source of the memory cell 201 (i.e., the source S1 of the transistor N1). A voltage $V_{SG}$ is applied via the selector gate SG to the gate G1 of the transistor N1. A voltage $V_{WL}$ is applied to the word line WL, resulting in a voltage $V_{NW1}$ in the well region NW1 which is transferred via the capacitive coupling of the capacitor $C_{WL}$ to the floating gate FG. A voltage $V_{EG}$ is applied to the erase gate EG, resulting in a voltage $V_{NW2}$ in the well region NW2 which is transferred via the capacitive coupling of the capacitor $C_{EG}$ to the floating gate FG. A bulk voltage $V_B$ is applied to the bulk of the transistor N1 and transistor N2, i.e., to the well region PW. In some embodiments, by controlling one or more of the voltages $V_D$, $V_{WL}$, $V_{SG}$, $V_{EG}$, $V_S$ and $V_B$, the memory cell 201 is programmed, read, erased or unselected during a program operation, a read operation or an erase operation of one or more other memory cells in the memory device.

Operation conditions of the memory cell 201 in accordance with some embodiments are summarized in the below Table.

TABLE

| Operation Condition | $V_D$ | $V_{WL}$ (=$V_{NW1}$) | $V_{SG}$ | $V_{EG}$ (=$V_{NW2}$) | $V_S$ | $V_B$ |
|---|---|---|---|---|---|---|
| Program | >$V_S$ | >$V_S$ | >$V_S$ | =$V_{WL}$ or 0 V | >=0 V | 0 V |
| Erase | 0 V | 0 V | 0 V | >>$V_{WL}$ | 0 V | 0 V |
| Read | >$V_S$ | >$V_S$ | >$V_S$ | =$V_{WL}$ or 0 V | 0 V | 0 V |

In a program operation in accordance with some embodiments, $V_{WL}$ and $V_{SG}$ are greater than $V_S$ to turn ON the corresponding transistor N1 and transistor N2. $V_D$ is greater than $V_S$ to create a sufficiently strong electric field that causes channel hot electron (CHE) injection in which hot electrons travel toward the drain and are injected into floating gate FG, changing a threshold voltage of the memory cell 201 and storing a datum in the transistor N2. The voltage of the floating gate FG is controlled by $V_{WL}$. $V_{EG}$ is controlled to be between $V_{WL}$ and zero to reduce influence of $V_{EG}$ on the voltage of the floating gate FG. $V_S$ is controlled to be greater than or equal to zero. Compared to other approaches which use a non-zero $V_S$ during a program operation involving CHE injection, at least one embodiment permits $V_S$ to be zero during a program operation. As a result, power consumption and/or control complexity is reduced.

In an erase operation in accordance with some embodiments, all voltages other than $V_{EG}$ are zero. $V_{EG}$ is controlled to create a sufficiently strong electric field between the erase gate EG and the word line WL for causing electrons to be discharged from the floating gate FG by using the Fowler-Nordheim (F-N) tunneling effect. The described erase operation involves application of a sufficient voltage across the erase gate EG and the word line WL. Compared to other approaches where other mechanisms, such as Drain Avalanche Hot Hole Injection (DAHHI), and/or other voltage control schemes are used in erase operations, the erase operation in one or more embodiments is simpler and reduces power consumption and/or control complexity.

In a read operation in accordance with some embodiments, $V_{WL}$ and $V_{SG}$ are greater than $V_S$ to turn ON the corresponding transistor N1 and transistor N2. A read current flows through the transistor N1 and transistor N2. A level of the read current indicates the datum stored in the transistor N2. For example, when logical "0" is stored, the read current is higher than when logical "1" is stored. By sensing the read current, the datum stored in the transistor N2 is read out.

One or more reasons for configuring the capacitor $C_{WL}$ to have a larger capacitance than the capacitor $C_{EG}$ in accordance with some embodiments are described herein. The total capacitance $C_{Total}$ of the floating gate FG is determined as follows:

$$C_{Total}=C_{EG}+C_{CELL}+C_{WL}$$

where $C_{CELL}$ is a parasitic capacitor in the transistor N2. In some embodiments, $C_{CELL}$ is omitted.

The effective bias $V_{FG}$ on the floating gate FG is determined as follows $$V_{FG}=V_{EG}*CR\_EG+V_{WL}*CR\_WL+Q_{FG}/C_{total}$$

where CR_EG is a coupling ratio on the erase gate EG and CR_EG=$C_{EG}/C_{Total}$, CR_WL is a coupling ratio on the word line WL and CR_WL=$C_{WL}/C_{Total}$, and $Q_{FG}$ is the amount of charges stored in the floating gate FG.

When $C_{WL}$ is larger than $C_{EG}$, CR_WL is larger than CR_EG. As a result, $V_{FG}$ depends more strongly on $V_{WL}$ than $V_{EG}$. The greater the ratio $C_{WL}/C_{EG}$, the more strongly $V_{FG}$ depends on $V_{WL}$. In some embodiments, the ratio $C_{WL}/C_{EG}$ is in a range from 10:1 to 20:1. In at least one embodiment, the ratio $C_{WL}/C_{EG}$ in the range from 10:1 to 20:1 provides one or more effects including, but not limited to, reasonable cell size and electrical performance.

When $V_{FG}$ depends strongly on $V_{WL}$, a gate bias in the memory cell 201 is controlled substantially by $V_{WL}$ on the word line WL, with insignificant influences from the erase gate EG, which is advantageous in some embodiments for the program and/or read operations.

In some situations, during an erase operation, the efficiency of the F-N tunneling depends on the bias difference between $V_{EG}$ and $V_{FG}$. When $V_{FG}$ depends strongly on $V_{WL}$, then $V_{FG}$~$V_{WL}$. In an erase operation in accordance with some embodiments, $V_{WL}$ is zero and $V_{FG}$ is close to zero. As a result, the efficiency of the erase operation, in some embodiments, is substantially controlled by $V_{EG}$ on the erase gate EG.

Figure 3:
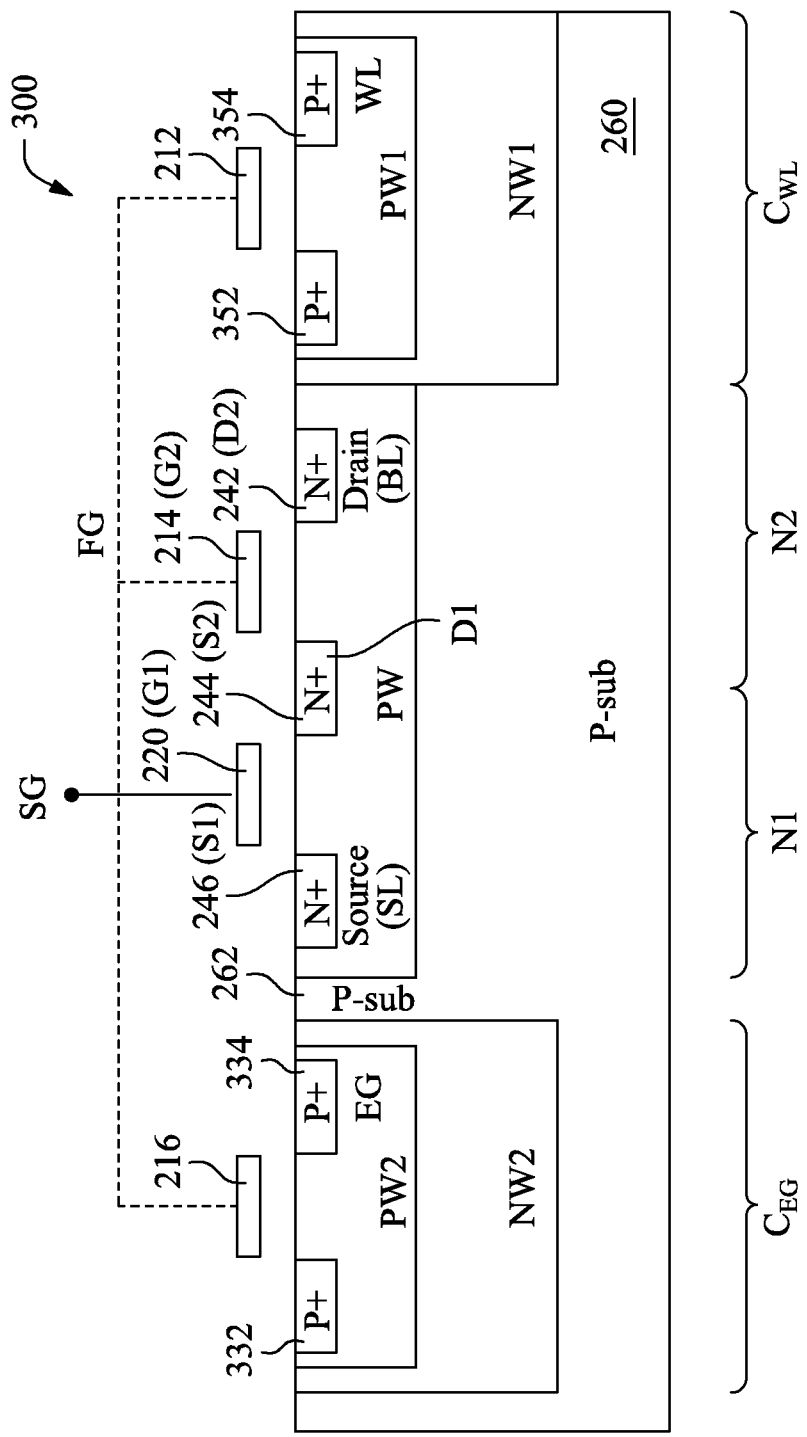
FIGS. 3-5 are cross-sectional views of various memory cells, in accordance with some embodiments.

FIG. 3 is a cross-sectional view similar to FIG. 2B, and shows a memory cell 300 in accordance with some embodiments. Compared to the memory cell 201 in FIG. 2B, the capacitor $C_{WL}$ and the capacitor $C_{EG}$ in the memory cell 300 include p-type capacitors, instead of n-type capacitors as in the memory cell 201. One electrode of the capacitor $C_{WL}$ is configured by the first portion 212 of the floating gate FG. The other electrode of the capacitor $C_{WL}$ is configured by a p-well region PW1 in the well region NW1. P+ doped regions 352, 354 are in the well region PW1. One of the regions 352, 354 is coupled to the word line WL. For example, the region 354 is coupled to the word line WL. In at least one embodiment, the regions 352, 354 and the well region PW1 correspond to the regions 252, 254 and the well region NW1 in the memory cell 201. One electrode of the capacitor $C_{EG}$ is configured by the third portion 216 of the floating gate FG. The other electrode of the capacitor $C_{EG}$ is configured by a p-well region PW2 in the well region NW2. P+ doped regions 332, 334 are in the well region PW2. One of the regions 332, 334 is coupled to the erase gate EG. For example, the region 334 is coupled to the erase gate EG. In at least one embodiment, the regions 332, 334 and the well region PW2 correspond to the regions 232, 234 and the well region NW2 in the memory cell 201. In the example configuration of FIG. 3, the well regions PW, PW1 and PW2 have the same depth and/or formed in the same ion implantation process. Other arrangements are within the scope of various embodiments. The memory cell 300 operates and achieves one or more effects as described herein with respect to the memory cell 201.

In some embodiments, the well region PW, well region PW1 and well region PW2 are implemented as separate p-wells, and/or the well region NW1 and the well region NW2 are implemented as separate n-wells. In some embodiments, the well region PW, well region PW1 and well region PW2 are implemented by a single p-well, and/or the well region NW1 and the well region NW2 are implemented by a single n-well.

Figure 4:
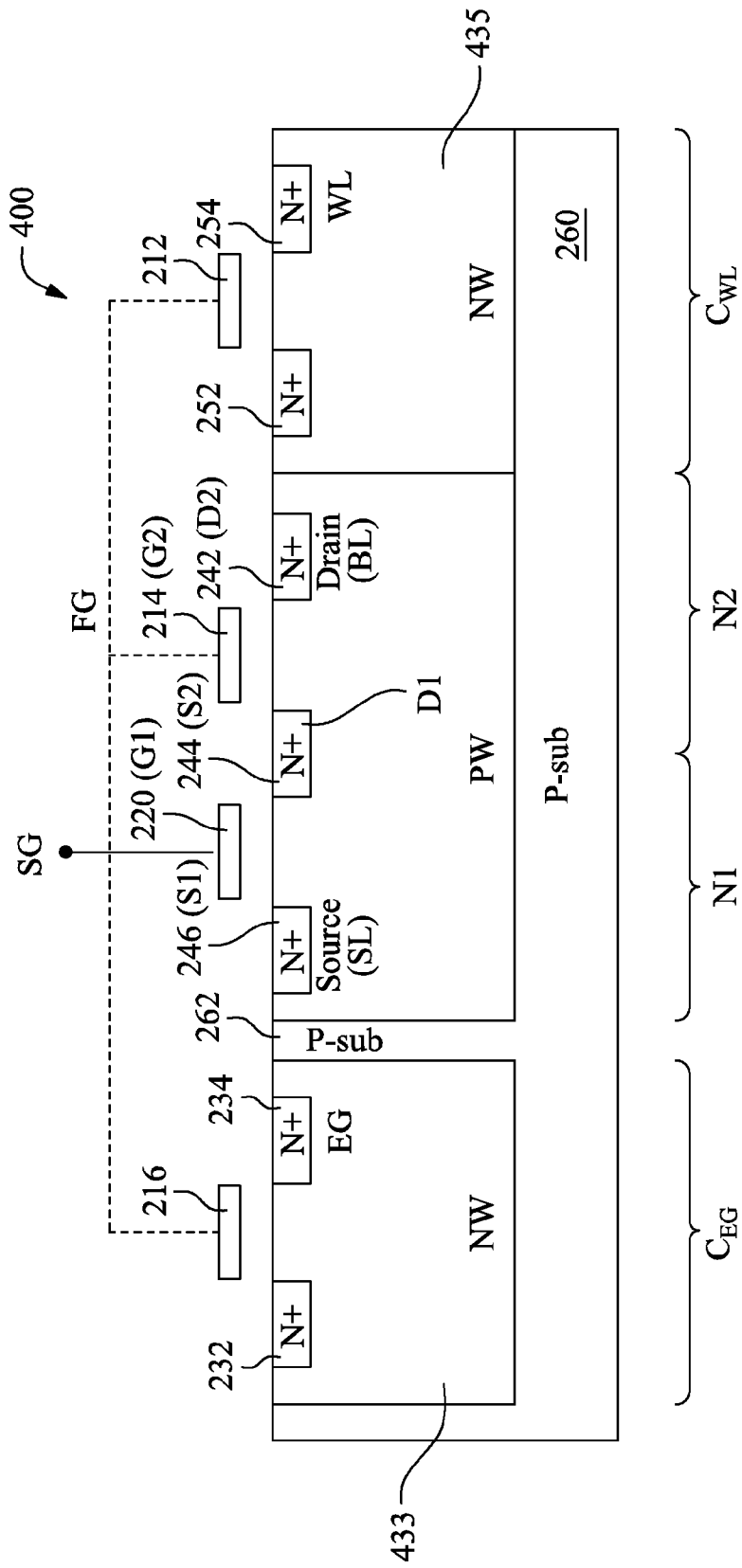

FIG. 4 is a cross-sectional view similar to FIG. 2B, and shows a memory cell 400 in accordance with some embodiments. Compared to the memory cell 201 in FIG. 2B, the memory cell 400 includes a single n-well NW that includes both a well region 433 corresponding to the third portion 216 of the floating gate FG, and a well region 435 corresponding to the first portion 212 of the floating gate FG. In at least one embodiment, in a view similar to the layout in FIG. 2A, a boundary of the n-well NW extends continuously around the well region PW. The memory cell 400 operates and achieves one or more effects as described herein with respect to the memory cell 201.

Figure 5:
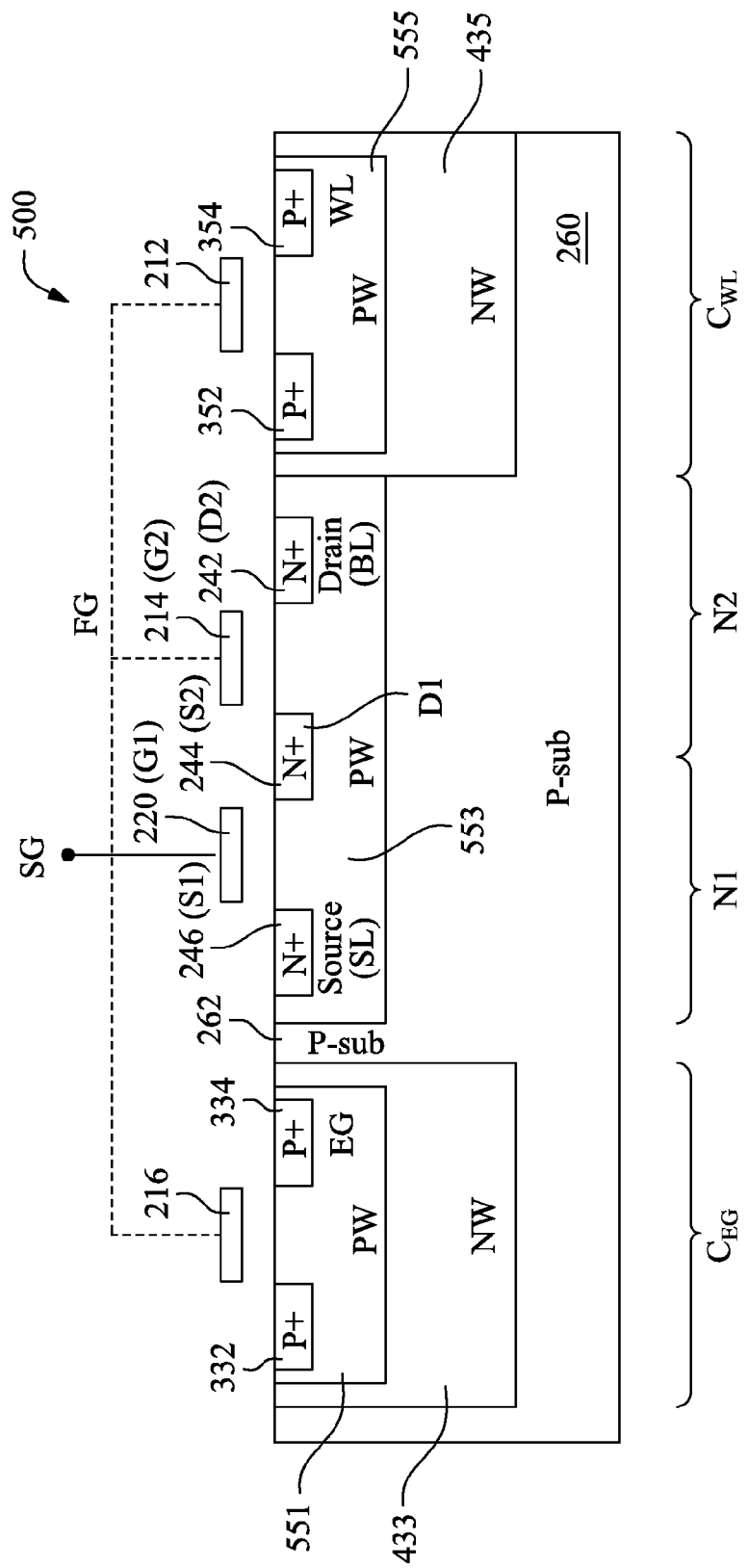

FIG. 5 is a cross-sectional view similar to FIG. 2B, and shows a memory cell 500 in accordance with some embodiments. Compared to the memory cell 300 in FIG. 3, the memory cell 400 includes a single n-well NW and a single p-well PW. The n-well NW includes both the well region 433 corresponding to the third portion 216 of the floating gate FG, and the well region 435 corresponding to the first portion 212 of the floating gate FG, as described with respect to FIG. 4. The p-well PW includes a well region 551 corresponding to the third portion 216 of the floating gate FG, a well region 553 corresponding to the second portion 214 of the floating gate FG and the selector gate SG, and a well region 555 corresponding to the first portion 212 of the floating gate FG. The memory cell 500 operates and achieves one or more effects as described herein with respect to the memory cell 201.

The described configurations for a memory device and/or a memory cell and/or a layout of a memory cell are examples. Other arrangements are within the scope of various embodiments. For example, in some embodiments, the two transistors in a memory cell having a 2T2C configuration are PMOS transistors. In some embodiments, one of the capacitors in a memory cell having a 2T2C configuration is an n-type capacitor, and the other capacitor is a p-type capacitor.

Embodiments that combine different features and/or different embodiments are within the scope of the disclosure and will be apparent to those of ordinary skill in the art after reviewing various embodiments.

Some embodiments provide a 2T2C configuration for a memory cell. In a 2T2C memory cell in accordance with some embodiments, a floating gate of one of the transistors is also configured as electrodes of the two capacitors, for capacitive coupling with a word line and an erase gate. A 2T2C memory cell in accordance with some embodiments is configured to be programmed by CHE injection and erased by F-N tunneling, in a manner simpler than other approaches. In at least one embodiment, the two transistors are NMOS transistors, and the two capacitors are either n-type or p-type capacitors. Such a configuration, in at least one embodiment, is compatible with advanced manufacturing processes, for example, at 55 nm and smaller.

In some embodiments, a memory device comprises at least one memory cell. The memory cell comprises first and second transistors, and first and second capacitors. The first transistor is coupled to a source line. The second transistor is coupled to the first transistor and a bit line. The first capacitor is coupled to a word line and the second transistor. The second capacitor is coupled to the second transistor and an erase gate.

In some embodiments, a layout of a memory cell comprises first, second and third active area patterns, and first and second conductive patterns. The first conductive pattern extends over the second active area pattern to form a first transistor, and extends over the second active area pattern to form a second transistor. The second conductive pattern extending over the first active area pattern to form a first capacitor, and extends over the third active area pattern to form a second capacitor. The second conductive pattern is a floating conductive pattern.

In some embodiments, a memory cell comprises a substrate, first, second and third well regions in the substrate, first and second transistors over the second well region, and a floating gate over the first, second and third well regions. The second well region is between the first well region and the third well region. A drain of the first transistor is configured to form with and coupled to a source of the second transistor. A first portion of the floating gate over the first well region is configured to form with and coupled to the first well region. A second portion of the floating gate over the second well region is configured to form a gate of the second transistor. A third portion of the floating gate over the third well region is configured to form with and coupled to the third well region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A layout of a memory cell, the layout comprising:
a first active area pattern;
a second active area pattern;
a third active area pattern, wherein the first, second and third active area patterns are elongated in an elongation direction;
a first conductive pattern extending over the second active area pattern to form a first transistor, wherein the first conductive pattern extends beyond a boundary of the second active area pattern; and
a second conductive pattern extending over the first active area pattern to form a first capacitor, extending over the second active area pattern to form a second transistor, and extending over the third active area pattern to form a second capacitor, wherein the second conductive pattern is a floating conductive pattern, and a width, in the elongation direction, of the second conductive pattern extending over the second active area pattern is different from a width, in the elongation direction, of the second conductive pattern extending over the third active area pattern.

2. The layout of claim 1, wherein
the first conductive pattern and the second conductive pattern belong to a same conductive layer.

3. The layout of claim 1, wherein
in the elongation direction, a width of the second conductive pattern over the first active area pattern is greater than the width of the second conductive pattern over the third active area pattern.

4. The layout of claim 1, wherein
in the elongation direction, the width of the second conductive pattern over the second active area pattern is smaller than a width of the second conductive pattern over the first active area pattern and is greater than the width of the second conductive pattern over the third active area pattern.

5. The layout of claim 1, further comprising:
a first well region;
a second well region; and
a third well region,
wherein
the first active area pattern is in the first well region,
the second active area pattern is in the second well region,
the third active area pattern is in the third well region, and
a first area in which the second conductive pattern extends over the first active area pattern and the first well region is larger than a second area in which the second conductive pattern extends over the third active area pattern and the third well region.

6. The layout of claim 1, further comprising:
a first well region;
a second well region; and
a third well region,
wherein
the first active area pattern is in the first well region,
the second active area pattern is in the second well region,
the third active area pattern is in the third well region,
the second well region is between the first well region and the third well region, and
the second well region is spaced from the third well region.

7. The layout of claim 1, further comprising:
a first connector in the first active area pattern, the first connector configured to form an electrical connection from the first capacitor to a word line;
a second connector in the third active area pattern, the second connector configured to form an electrical connection from the second capacitor to an erase line;
a third connector in the first conductive pattern, the third connector configured to form an electrical connection from the first conductive pattern to a selector line;
a fourth connector in the second active area pattern, the fourth connector configured to form an electrical connection from the first transistor to a source line; and
a fifth connector in the second active area pattern, the fifth connector configured to form an electrical connection from the second transistor to a bit line.

8. The layout of claim 7, wherein
along the second conductive pattern, the second active area pattern is between the first active area pattern and the third active area pattern, and
along the second active area pattern, the first and second conductive patterns are between the fourth conductor and the fifth conductor.

9. A memory cell, comprising:
a substrate;
a first well region in the substrate;
a second well region in the substrate;
a third well region in the substrate, the second well region being between the first well region and the third well region;
a first transistor over the second well region;
a second transistor over the second well region, wherein the second transistor is separated from the first transistor in a first direction; and
a floating gate over the first, second and third well regions, wherein
a drain of the first transistor is configured to form with and coupled to a source of the second transistor,
a first portion of the floating gate over the first well region is configured to form with and coupled to the first well region,
a second portion of the floating gate over the second well region is configured to form a gate of the second transistor, and
a third portion of the floating gate over the third well region is configured to form with and coupled to the third well region, wherein a width of the second portion of the floating gate in the first direction is greater than a width of the third portion of the floating gate in the first direction, and the width of the second portion of the floating gate in the first direction is less than a width of the first portion of the floating gate in the first direction.

10. The memory cell of claim 9, wherein the floating gate is a single, continuous pattern of polysilicon.

11. The memory cell of claim 9, wherein
the first and second transistors are n-channel metal-oxide semiconductor (NMOS) transistors.

12. The memory cell of claim 11, wherein
the first and third well regions are separate n-wells or parts of a single n-well, and
the second well region is a p-well.

13. The memory cell of claim 11, wherein
the first, second and third well regions are separate p-wells or parts of a single p-well, and
the memory cell further comprising:
a fourth well region, wherein the first well region is in the fourth well region, and
a fifth well region, wherein the third well region is in the fifth well region, and wherein the fourth and fifth well regions are separate n-wells or parts of a single n-well.

14. The memory cell of claim 9, wherein
the first and second transistors are p-channel metal-oxide semiconductor (PMOS) transistors.

15. A layout of a memory cell, the layout comprising:
a first well having a first dopant type;
a second well having a second dopant type different from the first dopant type;
a third well having the first dopant type, wherein the second well is between the first well and the third well in a first direction;
a fourth well having the second dopant type embedded in the first well;
a first conductive pattern defining a first gate over the second well; and
a second conductive pattern extending over the first well, the second well and the third well, wherein the second conductive pattern defines a second gate over the second well, a width, in a second direction perpendicular to the first direction, of the second conductive pattern extending over the second well is different from a width, in the second direction, of the second conductive pattern extending over the third well, and the second conductive pattern over the fourth well defines an electrode of a capacitor.

16. The layout of the memory cell of claim 15, wherein the third well is spaced from the second well in the first direction.

17. The layout of the memory cell of claim 15, wherein the first well directly contacts the second well.

18. The layout of the memory cell of claim 15, wherein the width of the second conductive pattern over the second well is greater than the width of the second conductive pattern over the third well.

19. The layout of the memory cell of claim 15, wherein a width, in the second direction, of the second conductive pattern over the first well is greater than the width of the second conductive pattern over the second well.

20. The layout of the memory cell of claim 15, wherein the third well is spaced from the second well.

* * * * *